(12) United States Patent
Kagawa et al.

(10) Patent No.: US 11,895,463 B2
(45) Date of Patent: Feb. 6, 2024

(54) PIEZOELECTRIC ELEMENT

(71) Applicant: FUJIFILM Corporation, Tokyo (JP)

(72) Inventors: Yusuke Kagawa, Minamiashigara (JP); Teruo Ashikawa, Minamiashigara (JP); Kazuo Hiraguchi, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 142 days.

(21) Appl. No.: 17/742,193

(22) Filed: May 11, 2022

(65) Prior Publication Data

US 2022/0272458 A1 Aug. 25, 2022

Related U.S. Application Data

(63) Continuation of application No. PCT/JP2020/040245, filed on Oct. 27, 2020.

(30) Foreign Application Priority Data

Nov. 12, 2019 (JP) ................................ 2019-204683

(51) Int. Cl.
*H04R 17/00* (2006.01)
*H04R 17/02* (2006.01)
(Continued)

(52) U.S. Cl.
CPC ........... *H04R 17/005* (2013.01); *H04R 17/00* (2013.01); *H04R 17/025* (2013.01);
(Continued)

(58) Field of Classification Search
CPC .... H04R 17/00; H04R 17/005; H04R 17/025; H04R 2217/01; H04R 2499/11; H10N 30/852; H10N 30/875; H10N 30/883
See application file for complete search history.

(56) References Cited

U.S. PATENT DOCUMENTS

2016/0008852 A1 1/2016 Miyoshi
2016/0014527 A1 1/2016 Miyoshi et al.
(Continued)

FOREIGN PATENT DOCUMENTS

EP    4 175 322 A1    5/2023
JP    2015-109627 A    6/2015
(Continued)

OTHER PUBLICATIONS

Extended European Search Report for corresponding European Application No. 20886248.2, dated Jun. 30, 2023.
(Continued)

*Primary Examiner* — Huyen D Le
(74) *Attorney, Agent, or Firm* — Birch, Stewart, Kolasch & Birch, LLP

(57) ABSTRACT

Provided is a piezoelectric element capable of preventing the occurrence of poor connection to an electrode layer.
A piezoelectric element includes a piezoelectric layer, electrode layers formed on both sides of the piezoelectric layer, and a protective layer laminated on a surface of the electrode layer opposite to a surface on a piezoelectric layer side, in which the piezoelectric element includes a conductive foil laminated on a surface of the protective layer opposite to the electrode layer, the protective layer has a hole that penetrates from a surface to the electrode layer, the conductive foil includes an opening portion at a position that overlaps with the hole of the protective layer in a surface direction, the piezoelectric element includes a filling member consisting of a conductive material, which is formed on at least a part of a surface of the conductive foil from insides of the hole of the protective layer and an opening portion of the conductive foil and is electrically connected to the electrode layer and the conductive foil, and a covering member that covers the filling member and the conductive foil, the covering member
(Continued)

has a through-hole at a position that does not overlap with the filling member in the surface direction, and the piezoelectric element includes a conductive member, which is inserted into the through-hole of the covering member and electrically connected to the conductive foil.

16 Claims, 4 Drawing Sheets

(51) Int. Cl.
  *H10N 30/85* (2023.01)
  *H10N 30/88* (2023.01)
(52) U.S. Cl.
  CPC ...... *H04R 2217/01* (2013.01); *H04R 2499/11* (2013.01); *H10N 30/852* (2023.02); *H10N 30/883* (2023.02)

(56) References Cited

U.S. PATENT DOCUMENTS

| | | | | |
|---|---|---|---|---|
| 2017/0331030 | A1* | 11/2017 | Inoue | ............ H10N 30/092 |
| 2018/0069172 | A1 | 3/2018 | Fukunaga et al. | |
| 2020/0176668 | A1 | 6/2020 | Ogawa | |
| 2022/0238785 | A1* | 7/2022 | Kagawa | ............ H04R 17/005 |
| 2023/0127642 | A1* | 4/2023 | Kagawa | ............ H04R 1/06 |
| | | | | 310/363 |

FOREIGN PATENT DOCUMENTS

| | | |
|---|---|---|
| JP | 2015-220434 A | 12/2015 |
| JP | 2016-15354 A | 1/2016 |
| JP | 2017-45984 A | 3/2017 |
| WO | WO 2016/181965 A1 | 11/2016 |
| WO | WO 2019/093092 A1 | 5/2019 |
| WO | WO 2022/190715 A1 | 9/2022 |

OTHER PUBLICATIONS

International Preliminary Report on Patentability and Written Opinion of the International Searching Authority (Forms PCT/IB/326, PCT/IB/373, and PCT/ISA/237) for International Application No. PCT/JP2020/040245, dated May 27, 2022, with an English translation.

International Search Report (Form PCT/ISA/210) for International Application No. PCT/JP2020/040245, dated Dec. 28, 2020, with an English translation.

* cited by examiner

PIEZOELECTRIC ELEMENT

CROSS-REFERENCE TO RELATED APPLICATIONS

This application is a Continuation of PCT International Application No. PCT/JP2020/040245 filed on Oct. 27, 2020, which claims priority under 35 U.S.C. § 119(a) to Japanese Patent Application No. 2019-204683 filed on Nov. 12, 2019. The above application is hereby expressly incorporated by reference, in its entirety, into the present application.

BACKGROUND OF THE INVENTION

1. Field of the Invention

The present invention relates to a piezoelectric element.

2. Description of the Related Art

With reduction in thickness of displays such as liquid crystal displays or organic EL displays, speakers used in these thin displays are also required to be lighter and thinner. Further, in flexible displays having flexibility, speakers are also required to have flexibility in order to be integrated with flexible displays without impairing lightness and flexibility. It is considered to adopt a sheet-like piezoelectric element (electroacoustic conversion film) having properties of stretching and contracting in response to an applied voltage, for such a light and thin speaker having flexibility.

As such a sheet-like piezoelectric element having flexibility, a piezoelectric element having an electrode layer and a protective layer on both sides of a piezoelectric layer is suggested.

For example, JP2016-015354A discloses an electroacoustic conversion film including a layer having dielectric properties, thin film electrodes formed on both sides of the layer having dielectric properties (piezoelectric layer), and protective layers formed on surfaces of both thin film electrodes, in which at least one of the protective layers has a thin layer portion having a film thickness thinner than that of a peripheral portion.

In such an electroacoustic conversion film, in order to apply a voltage to the electrode layer to vibrate the electroacoustic conversion film, it is required to make the thickness of the electrode layer extraordinarily thin. For example, a vaporized film having a thickness of 1 μm or less and the like are suitable for the electrode layer.

On the other hand, in order to mount the electroacoustic conversion film as a speaker or the like, it is required to draw the electrode layer and connect a wire here.

However, it is difficult to draw a thin electrode layer such as the vaporized film out of a surface of the electroacoustic conversion film. In addition, in a case where a thin electrode such as a vaporized film is exposed to the outside for connection with the wire and stored in this state, the electrode is oxidized depending on the storage environment and the conductivity is lowered.

On the other hand, it is suggested that a hole is provided in the protective layer, a conductive material is inserted into the hole, and a lead-out wire is connected to the conductive material.

For example, JP2016-015354A discloses a configuration in which a recess portion is provided in the protective layer, a conductive material is inserted into the recess portion, and a lead-out wire for electrically connecting the electrode layer and an external device is connected to the conductive material. With this, it is disclosed that the electrical connection between the electrode layer and the lead-out wire can be secured, and the electrode layer is completely covered with the protective layer, and thus it is possible to prevent the electrode layer from being deteriorated due to oxidation or the like.

SUMMARY OF THE INVENTION

However, in a case where the protective layer is provided with a hole, the electrode layer in a portion where the protective layer is removed is easily broken by a slight external force. Therefore, in a case where a conductive material is inserted into the hole of the protective layer to provide an electrical contact point, in a case where an external force is directly applied to the conductive material, an external force is applied to the electrode layer by the force of peeling between the conductive material and the electrode layer. As a result, there is a problem that the electrode layer is broken and poor connection to the electrode layer occurs.

An object of the present invention is to solve a problem of such a related art, and to provide a piezoelectric element capable of preventing the occurrence of poor connection to the electrode layer.

In order to achieve the above-described object, the present invention has the following configurations.

[1] A piezoelectric element including a piezoelectric layer, electrode layers formed on both sides of the piezoelectric layer, and a protective layer laminated on a surface of the electrode layer opposite to a surface on a piezoelectric layer side, in which the piezoelectric element includes a conductive foil laminated on a surface of the protective layer opposite to the electrode layer, the protective layer has a hole that penetrates from a surface to the electrode layer, the conductive foil includes an opening portion at a position that overlaps with the hole of the protective layer in a surface direction, the piezoelectric element includes a filling member consisting of a conductive material, which is formed on at least a part of a surface of the conductive foil from insides of the hole of the protective layer and an opening portion of the conductive foil and is electrically connected to the electrode layer and the conductive foil, a covering member that covers at least a part of the filling member and the conductive foil, the covering member has a through-hole at a position that does not overlap with the filling member in the surface direction, and the piezoelectric element includes a conductive member, which is inserted into the through-hole of the covering member and electrically connected to the conductive foil.

[2] The piezoelectric element as described in [1], in which the covering member covers an entire surface of the filling member and the conductive foil.

[3] The piezoelectric element as described in [1] or [2], in which the protective layer has a plurality of the holes and the filling member is provided in each of the plurality of holes, and a plurality of the filling members are connected on the surface of the conductive foil.

[4] The piezoelectric element as described in any one of [1] to [3], in which a thickness of the protective layer is 3 μm to 100 μm.

[5] The piezoelectric element as described in any one of [1] to [4], in which a thickness of the electrode layer is 0.05 μm to 10 μm.

[6] The piezoelectric element as described in any one of [1] to [5], in which the piezoelectric layer consists of a polymer composite piezoelectric body containing piezoelectric particles in a matrix containing a polymer material.

According to the present invention, there is provided a piezoelectric element capable of preventing the occurrence of poor connection to an electrode layer.

DESCRIPTION OF THE PREFERRED EMBODIMENTS

Hereinafter, a piezoelectric element of an embodiment of the present invention will be described in detail based on suitable examples shown in the accompanying drawings.

Descriptions of the constituent requirements described below may be made based on representative embodiments of the present invention, but the present invention is not limited to such embodiments.

In the present specification, a numerical range expressed using "to" means a range including numerical values described before and after "to" as a lower limit and an upper limit.

Piezoelectric Element

A piezoelectric element of the embodiment of the present invention is a piezoelectric element including a piezoelectric layer, electrode layers formed on both sides of the piezoelectric layer, and a protective layer laminated on a surface of the electrode layer opposite to a surface on a piezoelectric layer side, in which the piezoelectric element includes a conductive foil laminated on a surface of the protective layer opposite to the electrode layer, the protective layer has a hole that penetrates from a surface to the electrode layer, the conductive foil includes an opening portion at a position that overlaps with the hole of the protective layer in a surface direction, the piezoelectric element includes a filling member consisting of a conductive material, which is formed on at least a part of a surface of the conductive foil from insides of the hole of the protective layer and an opening portion of the conductive foil and is electrically connected to the electrode layer and the conductive foil, a covering member that covers the filling member and the conductive foil, the covering member has a through-hole at a position that does not overlap with the filling member in the surface direction, and the piezoelectric element further including a conductive member that is inserted into the through-hole of the covering member and electrically connected to the conductive foil.

Figure 1:
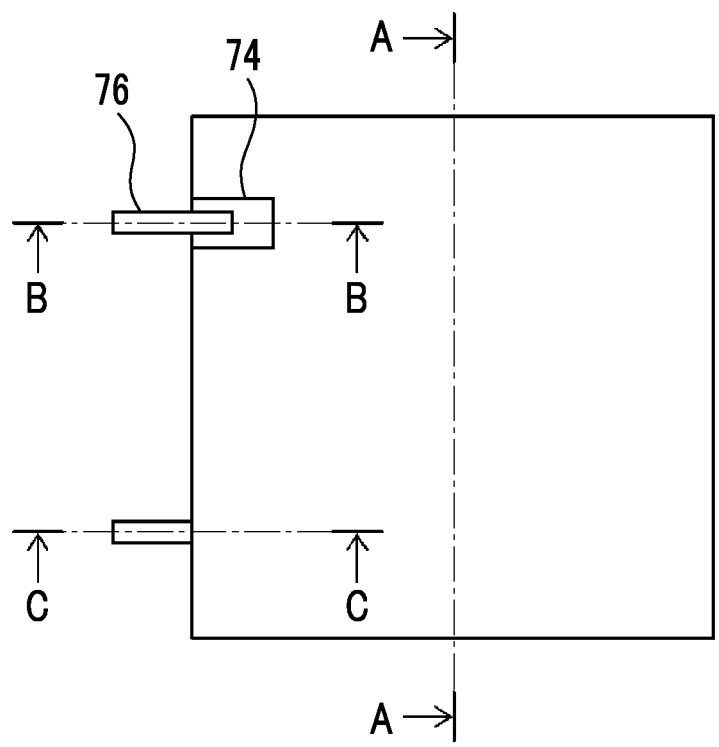
FIG. 1 is a plan view schematically illustrating an example of a piezoelectric element of the present invention.
Figure 2:
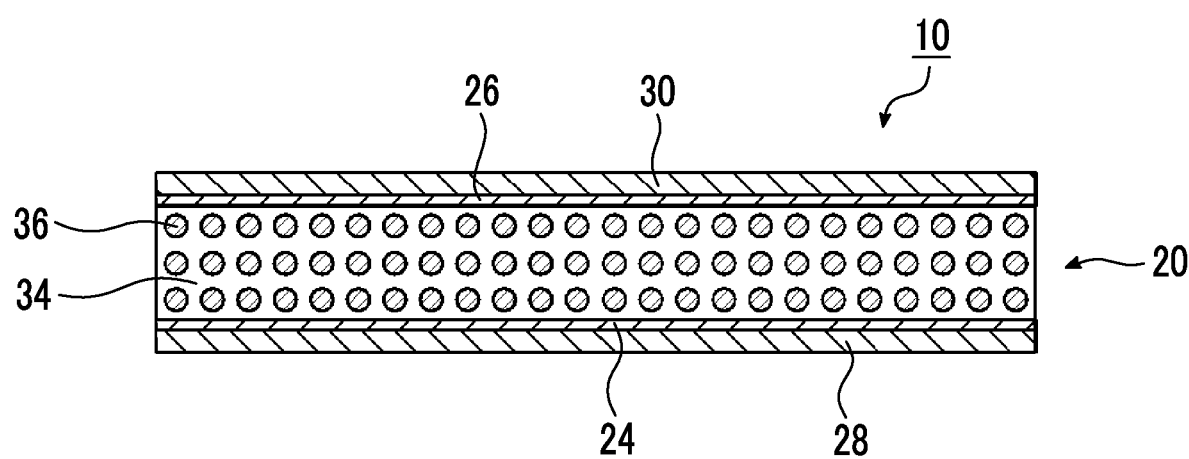
FIG. 2 is a cross-sectional view taken along line A-A of FIG. 1.
Figure 3:
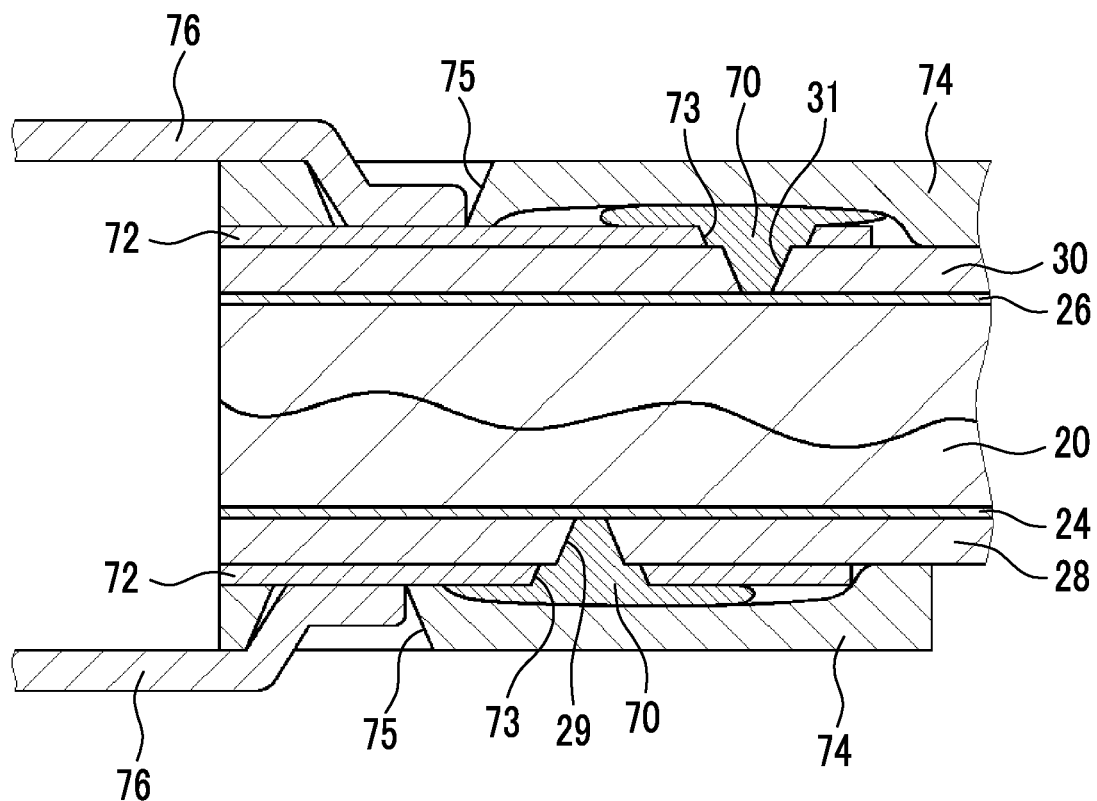
FIG. 3 is a cross-sectional view taken along line B-B of FIG. 1.

FIG. 1 illustrates a plan view schematically illustrating an example of a piezoelectric element of the embodiment of the present invention. FIG. 2 illustrates a sectional view taken along line A-A of the piezoelectric element of FIG. 1. FIG. 3 illustrates an enlarged cross-sectional view of a part of a cross-section taken along line B-B and a cross-section taken along line C-C of the piezoelectric element of FIG. 1. FIG. 3 illustrates a view of a cross-section taken along line B-B on an upper side in the figure, and illustrates a view of a cross-section taken along line C-C on a lower side in the figure.

A piezoelectric element 10 as illustrated in FIGS. 1 to 3 includes a piezoelectric layer 20 which is a sheet-like material having piezoelectric properties, a lower electrode 24 laminated on one surface of the piezoelectric layer 20, a lower protective layer 28 laminated on the lower electrode 24, an upper electrode 26 laminated on the other surface of the piezoelectric layer 20, an upper protective layer 30 laminated on the upper electrode 26, a filling member 70, a conductive foil with a bonding layer 72, a covering member 74, and a conductive member 76.

The piezoelectric layer 20 illustrated in FIG. 1 contains piezoelectric particles 36 in a matrix 34 containing a polymer material. In addition, the lower electrode 24 and the upper electrode 26 are electrode layers in the present invention. In addition, a lower protective layer 28 and an upper protective layer 30 are protective layers in the present invention. In addition, the conductive foil with a bonding layer 72 is the conductive foil in the present invention.

The bonding layer of the conductive foil with a bonding layer 72 is a layer for adhering the protective layer and the conductive foil, but the conductive foil is not limited to the conductive foil with a bonding layer, and may be adhered to the protective layer using a bonding agent or an adhesive. At this time, the bonding agent or the adhesive is not particularly limited as long as the protective layer and the conductive foil can be adhered to each other, but acrylic-based, urethane-based, and silicon-based bonding agents (adhesives) are suitably used.

As will be described later, the piezoelectric element 10 (piezoelectric layer 20) is polarized in a thickness direction as a preferable aspect.

As illustrated in FIG. 3, the upper protective layer 30 has a hole 31 penetrating from the surface to the upper electrode 26. That is, the hole 31 is formed so as to penetrate the upper protective layer 30 from a surface opposite to the upper electrode 26 to an interface on an upper electrode 26 side. As illustrated in FIGS. 1, the hole 31 is formed in the vicinity of an end portion of the upper protective layer 30 in a surface direction.

Similarly, the lower protective layer 28 has a hole 29 penetrating from the surface to the lower electrode 24. That is, the hole 29 is formed so as to penetrate the lower protective layer 28 from a surface opposite to the lower electrode 24 to an interface on a lower electrode 24 side. As illustrated in FIG. 1, the hole 29 is formed in the vicinity of an end portion of the lower protective layer 28 in a surface direction.

The conductive foil with a bonding layer 72 is attached to a surface of the upper protective layer 30 in the vicinity of the hole 31. The conductive foil with a bonding layer 72 is provided with a bonding layer on one surface of the conductive foil, and is attached to the upper protective layer 30 by laminating the bonding layer side toward the upper protective layer 30.

As illustrated in FIG. 3, the conductive foil with a bonding layer 72 has an opening portion 73 at a position that overlaps with the hole 31 of the upper protective layer 30 in the surface direction.

The filling member 70 consists of a conductive material, is filled in the hole 31 and the opening portion 73, and is formed so as to cover a part of the surface of the conductive foil with a bonding layer 72. The filling member 70 is in contact with the upper electrode 26 in the hole 31 and is electrically connected to the upper electrode 26. In addition, the filling member 70 is connected to the conductive foil with a bonding layer 72 on the surface of the conductive foil with a bonding layer 72.

The covering member 74 is an insulating sheet-like member, and is laminated so as to cover at least a part of the filling member 70 and the conductive foil with a bonding layer 72 in the surface direction. In the example illustrated in FIG. 1, the covering member 74 is laminated so as to cover the entire surface of the filling member 70 and the conductive foil with a bonding layer 72.

The covering member 74 has a through-hole 75 penetrating in a thickness direction at a position that overlaps with the conductive foil with a bonding layer 72 without overlapping with the filling member 70 in the surface direction.

The conductive member 76 is a sheet-like or wire-like member having conductivity. The conductive member 76 is inserted into the through-hole 75 of the covering member 74 and electrically connected to the conductive foil with a bonding layer 72.

Similarly, as illustrated in FIG. 3, the conductive foil with a bonding layer 72 having an opening portion 73 is attached to the surface of the lower protective layer 28 in the vicinity of the hole 29, the filling member 70 is filled in the hole 31 and the opening portion 73, the covering member 74 is laminated so as to cover at least a part of the filling member 70 and the conductive foil with a bonding layer 72, and the conductive member 76 is inserted into the through-hole 75 of the covering member 74 and electrically connected to the conductive foil with a bonding layer 72.

As described above, in the piezoelectric element 10, the conductive member 76 is electrically connected to the conductive foil with a bonding layer 72, the conductive foil with a bonding layer 72 is electrically connected to the filling member 70, and the filling member 70 is electrically connected to the electrode layer. Therefore, the conductive member 76 can be used as a lead-out wire, and the wire can be connected to the conductive member 76. Alternatively, the conductive member 76 can be used as a wire.

Here, as described above, in a case where the protective layer is provided with a hole, the electrode layer at a portion where the protective layer is removed is easily broken by a slight external force. Therefore, in a case where a conductive material is inserted into the hole of the protective layer to provide an electrical contact point, in a case where an external force is directly applied to the conductive material, an external force is applied to the electrode layer by the force of peeling between the conductive material and the electrode layer. As a result, there is a problem that the electrode layer is broken and poor connection to the electrode layer occurs.

On the other hand, in the piezoelectric element of the embodiment of the present invention, since the filling member filled in the hole of the protective layer is covered with the covering member, it is possible to suppress the filling member from being pulled by an external force. Therefore, it is possible to prevent the electrode layer from being broken due to an external force applied to the electrode layer due to the force of peeling between the conductive material and the electrode layer. In addition, since the filling member and the hole are covered with the covering member, it is possible to suppress the oxidation of the filling member and/or the electrode layer. In addition, since the covering member has a through-hole and the conductive member is electrically connected to the electrode layer via the conductive foil with a bonding layer and the filling member in the through-hole, it is possible to reliably perform electrical connection to the electrode layer.

Here, a shape of the opening surface of the holes 29 and 31 of the protective layer is not limited, but can be various shapes such as a circular shape, an elliptical shape, a rectangular shape, a polygonal shape, and an indefinite shape. The circular shape is preferable from a viewpoint of easiness of formation and the like.

In addition, a size of the opening surface of the hole is not particularly limited as long as an electrical connection with the filling member 70 can be secured and the piezoelectric element can operate properly. A circle equivalent diameter of the opening surface of the hole is preferably 0.5 mm to 20 mm, more preferably 1.5 mm to 5 mm, and even more preferably 2 mm to 3 mm.

In addition, the shape of the opening surface of the opening portion 73 of the conductive foil with a bonding layer 72 is not limited, and may be various shapes such as a circular shape, an elliptical shape, a rectangular shape, a polygonal shape, and an indefinite shape. The circular shape is preferable from a viewpoint of easiness of formation and the like.

In addition, a size of the opening surface of the opening portion 73 is not particularly limited as long as an electrical connection with the filling member 70 can be secured and the piezoelectric element can operate properly. From a viewpoint of securing electrical connection, the opening portion 73 preferably has a shape and size including the hole 31.

For example, in a case where a diameter of the hole 31 is 3 mm, an equivalent circle diameter of the opening surface of the opening portion 73 is preferably 4 mm to 20 mm, more preferably 5 mm to 15 mm, and even more preferably 5 mm to 12 mm.

In addition, a size (size in the surface direction) of the filling member 70 on the conductive foil with a bonding layer 72 is not particularly limited as long as the electrical connection with the conductive foil with a bonding layer 72 can be secured. The circle equivalent diameter of the filling member 70 on the conductive foil with a bonding layer 72 is preferably 1 mm to 40 mm, more preferably 2 mm to 30 mm, and even more preferably 2 mm to 20 mm.

In addition, a shape of an opening surface of the through-hole 75 of the covering member 74 is not limited, but can be various shapes such as a circular shape, an elliptical shape, a rectangular shape, a polygonal shape, and an indefinite shape.

In addition, the size of the opening surface of the through-hole 75 is not particularly limited as long as an electrical connection with the conductive member 76 can be secured and the piezoelectric element can operate properly. As a preferable aspect, an area of the opening surface of the through-hole 75 should be sufficiently larger than a total area of the hole 31. For example, in a case where the diameter of the hole 31 is 3 mm and the number of holes is 5, the total area of the holes is about 141 $mm^2$, but the size of the opening surface of the through-hole 75 is preferably 150 $mm^2$ or more, more preferably 150 $mm^2$ to 1,000 $mm^2$, and even more preferably 200 $mm^2$ to 700 $mm^2$.

Here, in the example illustrated in FIG. 3, there is provided a configuration including one hole 31 and one filling member 70, but the configuration is not limited thereto, and a plurality of the holes 31 and the filling members 70 may be provided.

For example, in a case of having two or more holes 31, the opening portion 73 of the conductive foil with a bonding layer 72 preferably has a size of including two or more holes 31, and the filling member 70 is preferably filled in each hole 31 via the opening portion 73. In addition, in a case of having two or more holes 31, the conductive foil with a bonding layer 72 has a plurality of opening portions 73 corresponding to each hole 31, and there may be provided a configuration in which the filling member 70 is filled in each hole 31 via each opening portion 73.

Here, in the example illustrated in FIG. 3, the conductive member 76 electrically connected to the upper electrode 26 via the filling member 70 and the conductive foil with a bonding layer 72 on the upper protective layer 30 side and the conductive member 76 electrically connected to the lower electrode 24 via the filling member 70 and the conductive foil with a bonding layer 72 on the lower protective layer 28 side are arranged so that positions in the surface direction do not overlap with each other as preferable aspects. With this, it is possible to suppress the conductive member 76 on the upper electrode 26 side and the conductive member 76 on the lower electrode 24 side from coming into contact with each other to cause a short circuit.

As an example, the piezoelectric element 10 is used in various acoustic devices (audio equipment) such as speakers, microphones, and pickups used in musical instruments such as guitars, to generate (reproduce) a sound due to vibration in response to an electrical signal or convert vibration due to a sound into an electrical signal.

In addition, the piezoelectric element can also be used in pressure-sensitive sensors, power generation elements, and the like, in addition to these.

In addition, for example, in a case where the piezoelectric element 10 is used for a speaker, the piezoelectric element 10 may be used as the one that generates sound by the vibration of the film-shaped piezoelectric element 10 itself. Alternatively, the piezoelectric element 10 may be used as an exciter that is attached to a vibration plate, vibrates the vibration plate due to vibration of the piezoelectric element 10, and generates sound.

Hereinafter, each constituent element of the piezoelectric element of the embodiment of the present invention will be described in detail.

Piezoelectric Layer

The piezoelectric layer 20 may be a layer consisting of a known piezoelectric body. In the present invention, the piezoelectric layer 20 is preferably a polymer composite piezoelectric body containing piezoelectric particles 36 in a matrix 34 including a polymer material.

As the material of the matrix 34 (serving as a matrix and a binder) of the polymer composite piezoelectric body constituting the piezoelectric layer 20, a polymer material having viscoelasticity at room temperature is preferably used.

The piezoelectric element 10 of the embodiment of the present invention is suitably used for a speaker having flexibility such as a speaker for a flexible display. Here, it is preferable that the polymer composite piezoelectric body (piezoelectric layer 20) used for a speaker having flexibility satisfies the following requisites. Accordingly, it is preferable to use a polymer material having a viscoelasticity at room temperature as a material satisfying the following requirements.

Furthermore, in the present specification, the "room temperature" indicates a temperature range of approximately 0° C. to 50° C.

(i) Flexibility

For example, in a case of being gripped in a state of being loosely bent like a newspaper or a magazine as a portable device, the polymer composite piezoelectric body is continuously subjected to large bending deformation from the outside at a comparatively slow vibration of less than or equal to a few Hz. In this case, in a case where the polymer composite piezoelectric body is hard, large bending stress is generated to that extent, and a crack is generated at the interface between the matrix and the piezoelectric particles, possibly leading to breakage. Accordingly, the polymer composite piezoelectric body is required to have suitable flexibility. In addition, in a case where strain energy is diffused into the outside as heat, the stress is able to be relieved. Accordingly, the loss tangent of the polymer composite piezoelectric body is required to be suitably large.

(ii) Acoustic Quality

A speaker vibrates the piezoelectric particles at a frequency of an audio band of 20 Hz to 20 kHz, and the vibration energy causes the entire polymer composite piezoelectric body (piezoelectric element) to vibrate integrally such that a sound is reproduced. Therefore, in order to increase a transmission efficiency of the vibration energy, the polymer composite piezoelectric body is required to have appropriate hardness. In addition, in a case where frequency properties of the speaker are smooth, an amount of change in acoustic quality in a case where the lowest resonance frequency is changed in association with a change in the curvature decreases. Therefore, the loss tangent of the polymer composite piezoelectric body is required to be suitably large.

As described above, a polymer composite piezoelectric body is required to be rigid with respect to a vibration of 20 Hz to 20 kHz, and be flexible with respect to a vibration of less than or equal to a few Hz. In addition, the loss tangent of the polymer composite piezoelectric body is required to be suitably large with respect to the vibration of all frequencies of less than or equal to 20 kHz.

In general, a polymer solid has a viscoelasticity relieving mechanism, and a molecular movement having a large scale is observed as a decrease (relief) in a storage elastic modulus (Young's modulus) or the local maximum (absorption) in a loss elastic modulus along with an increase in a temperature or a decrease in a frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer composite piezoelectric body (the piezoelectric layer 20), the polymer material of which the glass transition point is room temperature, in other words, the polymer material having viscoelasticity at room temperature is used in the matrix, and thus the polymer composite piezoelectric body which is rigid with respect to a vibration of 20 Hz to 20 kHz and is flexible with respect to a vibration of less than or equal to a few Hz is realized. In particular, from a viewpoint of suitably exhibiting such behavior, it is preferable that a polymer material of which the glass transition temperature at a frequency of 1 Hz is room temperature, that is, 0° C. to 50° C. is used in the matrix of the polymer composite piezoelectric body.

As the polymer material having viscoelasticity at room temperature, various known materials are able to be used as long as the material has dielectric properties. Preferably, a polymer material of which the maximum value of a loss tangent at a frequency of 1 Hz at room temperature, that is, 0° C. to 50° C. in a dynamic viscoelasticity test is greater than or equal to 0.5 is used.

Accordingly, in a case where the polymer composite piezoelectric body is slowly bent due to an external force, stress concentration on the interface between the matrix and the piezoelectric particles at the maximum bending moment portion is relieved, and thus good flexibility is obtained.

In addition, it is preferable that, in the polymer material, a storage elastic modulus (E') at a frequency of 1 Hz according to dynamic viscoelasticity measurement is greater than or equal to 100 MPa at 0° C. and is less than or equal to 10 MPa at 50° C.

Accordingly, it is possible to reduce a bending moment which is generated in a case where the polymer composite piezoelectric body is slowly bent due to the external force, and it is possible to make the polymer composite piezoelectric body rigid with respect to an acoustic vibration of 20 Hz to 20 kHz.

In addition, it is more suitable that the relative permittivity of the polymer material is greater than or equal to 10 at 25° C. Accordingly, in a case where a voltage is applied to the polymer composite piezoelectric body, a higher electric field is applied to the piezoelectric particles in the matrix, and thus a large deformation amount can be expected.

However, in consideration of securing good moisture resistance or the like, it is suitable that the relative permittivity of the polymer material is less than or equal to 10 at 25° C.

As the polymer material satisfying such conditions, cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, polybutyl methacrylate, and the like are exemplified. In addition, as these polymer materials, a commercially available product such as Hybrar 5127 (manufactured by Kuraray Co., Ltd.) is also able to be suitably used. Among them, as the polymer material, a material having a cyanoethyl group is preferably used, and cyanoethylated PVA is particularly preferably used.

Furthermore, only one of these polymer materials may be used, or a plurality of types thereof may be used in combination (mixture).

The matrix 34 using such a polymer material, as necessary, may use a plurality of polymer materials in combination.

That is, in order to control dielectric properties or mechanical properties, other dielectric polymer materials may be added to the matrix 34 in addition to the polymer material having viscoelasticity at room temperature, as necessary.

As the dielectric polymer material which is able to be added to the viscoelastic matrix, for example, a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, and a polyvinylidene fluoride-tetrafluoroethylene copolymer, a polymer having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, and a synthetic rubber such as nitrile rubber or chloroprene rubber are exemplified.

Among them, a polymer material having a cyanoethyl group is suitably used.

Furthermore, the dielectric polymer material added to the matrix 34 of the piezoelectric layer 20 in addition to the polymer material having viscoelasticity at room temperature such as cyanoethylated PVA is not limited to one dielectric polymer, and a plurality of dielectric polymers may be added.

In addition, for the purpose of controlling the glass transition point, a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, and mica may be added to the matrix 34 in addition to the dielectric polymer material.

Furthermore, for the purpose of improving adhesiveness, a viscosity imparting agent such as rosin ester, rosin, terpene, terpene phenol, and a petroleum resin may be added.

The amount of materials added to the matrix 34 of the piezoelectric layer 20 in a case where materials other than the polymer material having viscoelasticity such as cyanoethylated PVA is not particularly limited, and it is preferable that a ratio of the added materials to the matrix 34 is less than or equal to 30 mass %.

Accordingly, it is possible to exhibit properties of the polymer material to be added without impairing the viscoelasticity relieving mechanism of the matrix 34, and thus a preferable result is able to be obtained from a viewpoint of increasing a dielectric constant, of improving heat resistance, and of improving adhesiveness between the piezoelectric particles 36 and the electrode layer.

The piezoelectric layer 20 is a polymer composite piezoelectric body including the piezoelectric particles 36 in such a matrix 34.

The piezoelectric particles 36 consist of ceramics particles having a perovskite type or wurtzite type crystal structure.

As the ceramics particles forming the piezoelectric particles 36, for example, lead zirconate titanate (PZT), lead lanthanum zirconate titanate (PLZT), barium titanate (BaTiO$_3$), zinc oxide (ZnO), and a solid solution (BFBT) of barium titanate and bismuth ferrite (BiFe$_3$) are exemplified.

Only one of these piezoelectric particles 36 may be used, or a plurality of types thereof may be used in combination (mixture).

The particle diameter of the piezoelectric particles 36 is not limited, and may be appropriately selected depending on the size and the usage of the polymer composite piezoelectric body (piezoelectric element 10).

The particle diameter of the piezoelectric particles 36 is preferably 1 to 10 μm. By setting the particle diameter of the piezoelectric particles 36 to be in the range described above, a preferable result is able to be obtained from a viewpoint of allowing the polymer composite piezoelectric body (piezoelectric element 10) to achieve both high piezoelectric properties and flexibility.

In FIG. 2, the piezoelectric particles 36 in the piezoelectric layer 20 are uniformly dispersed in the matrix 34 with regularity, but the present invention is not limited thereto.

That is, in the matrix 34, the piezoelectric particles 36 in the piezoelectric layer 20 are preferably uniformly dispersed, and may also be irregularly dispersed.

In the piezoelectric layer 20 (polymer composite piezoelectric body), a quantitative ratio of the matrix 34 and the piezoelectric particles 36 in the piezoelectric layer 20 is not limited, and may be appropriately set according to the size in the surface direction or the thickness of the piezoelectric layer 20, the usage of the polymer composite piezoelectric body, properties required for the polymer composite piezoelectric body, and the like.

The volume fraction of the piezoelectric particles 36 in the piezoelectric layer 20 is set to preferably 30% to 80%, more preferably more than or equal to 50%, and therefore even more preferably 50% to 80%.

By setting the quantitative ratio of the matrix 34 and the piezoelectric particles 36 to be in the range described above, it is possible to obtain a preferable result from a viewpoint of making high piezoelectric properties and flexibility compatible.

The thickness of the piezoelectric layer 20 is not limited, and may be appropriately set according to the usage of the polymer composite piezoelectric body, properties required for the polymer composite piezoelectric body, and the like. The thicker the piezoelectric layer 20, the more advantageous it is in terms of rigidity such as the stiffness of a so-called sheet-like material, but the voltage (potential difference) required to stretch and contract the piezoelectric layer 20 by the same amount increases.

The thickness of the piezoelectric layer 20 is preferably 10 to 300 μm, more preferably 20 to 200 μm, and even more preferably 30 to 150 μm.

By setting the thickness of the piezoelectric layer 20 to be in the range described above, it is possible to obtain a preferable result from a viewpoint of compatibility between securing the rigidity and appropriate flexibility, or the like.

Electrode Layer and Protective Layer

As illustrated in FIG. 2, the piezoelectric element 10 of the illustrated example has a configuration in which the lower electrode 24 is provided on one surface of the piezoelectric layer 20, the lower protective layer 28 is provided on the surface thereof, the upper electrode 26 is provided on the other surface of the piezoelectric layer 20, and the upper protective layer 30 is provided on the surface thereof. Here, the upper electrode 26 and the lower electrode 24 form an electrode pair.

That is, the piezoelectric element 10 has a configuration in which both surfaces of the piezoelectric layer 20 are interposed between the electrode pair, that is, the upper electrode 26 and the lower electrode 24 and the laminate is further interposed between the lower protective layer 28 and the upper protective layer 30.

As described above, in the piezoelectric element 10, the region interposed between the upper electrode 26 and the lower electrode 24 is stretched and contracted according to an applied voltage.

The lower protective layer 28 and the upper protective layer 30 have a function of covering the upper electrode 26 and the lower electrode 24 and applying appropriate rigidity and mechanical strength to the piezoelectric layer 20. That is, there may be a case where, in the piezoelectric element 10, the piezoelectric layer 20 consisting of the matrix 34 and the piezoelectric particles 36 exhibits extremely superior flexibility under bending deformation at a slow vibration but has insufficient rigidity or mechanical strength depending on the usage. As a compensation for this, the piezoelectric element 10 is provided with the lower protective layer 28 and the upper protective layer 30.

The lower protective layer 28 and the upper protective layer 30 are not limited, and may use various sheet-like materials. As an example, various resin films are suitably exemplified.

Among them, by the reason of excellent mechanical properties and heat resistance, a resin film consisting of polyethylene terephthalate (PET), polypropylene (PP), polystyrene (PS), polycarbonate (PC), polyphenylene sulfite (PPS), polymethyl methacrylate (PMMA), polyetherimide (PEI), polyimide (PI), polyethylene naphthalate (PEN), triacetylcellulose (TAC), or a cyclic olefin-based resin is suitably used.

There is also no limitation on the thicknesses of the lower protective layer 28 and the upper protective layer 30. In addition, the thicknesses of the lower protective layer 28 and the upper protective layer 30 may basically be identical to each other or different from each other.

Here, in a case where the rigidity of the lower protective layer 28 and the upper protective layer 30 is too high, not only is the stretching and contracting of the piezoelectric layer 20 constrained, but also the flexibility is impaired. Therefore, it is advantageous in a case where the thicknesses of the lower protective layer 28 and the upper protective layer 30 are smaller unless mechanical strength or good handleability as a sheet-like material is required.

The thickness of the lower protective layer 28 and the upper protective layer 30 is preferably 3 μm to 100 μm, more preferably 3 μm to 50 μm, even more preferably 3 μm to 30 μm, and particularly preferably 4 μm to 10 μm.

Here, in the piezoelectric element 10, in a case where the thickness of the lower protective layer 28 and the upper protective layer 30 is less than or equal to twice the thickness of the piezoelectric layer 20, it is possible to obtain a preferable result from a viewpoint of compatibility between securing the rigidity and appropriate flexibility, or the like.

For example, in a case where the thickness of the piezoelectric layer 20 is 50 μm and the lower protective layer 28 and the upper protective layer 30 consist of PET, the thickness of the lower protective layer 28 and the upper protective layer 30 is preferably less than or equal to 100 μm, more preferably less than or equal to 50 μm, and even more preferably less than or equal to 25 μm.

In the piezoelectric element 10, the lower electrode 24 is formed between the piezoelectric layer 20 and the lower protective layer 28, and the upper electrode 26 is formed between the piezoelectric layer 20 and the upper protective layer 30.

The lower electrode 24 and the upper electrode 26 are provided to apply a driving voltage to the piezoelectric layer 20.

In the present invention, a forming material of the lower electrode 24 and the upper electrode 26 is not limited, and various conductors are able to be used. Specifically, metals such as carbon, palladium, iron, tin, aluminum, nickel, platinum, gold, silver, copper, titanium, chromium, and molybdenum, alloys thereof, laminates and composites of these metals and alloys, indium-tin oxide, and the like are exemplified. Among them, copper, aluminum, gold, silver, platinum, and indium-tin oxide are suitably exemplified as the lower electrode 24 and the upper electrode 26.

In addition, a forming method of the lower electrode 24 and the upper electrode 26 is not limited, and various known methods such as a vapor-phase deposition method (a vacuum film forming method) such as vacuum vapor deposition or sputtering, film formation using plating, and a method of bonding a foil formed of the materials described above are able to be used.

Among them, in particular, by the reason that the flexibility of the piezoelectric element 10 is able to be secured, a thin film made of copper, aluminum, or the like formed by using the vacuum vapor deposition is suitably used as the lower electrode 24 and the upper electrode 26. Among them, in particular, the copper thin film formed by using the vacuum vapor deposition is suitably used.

There is no limitation on the thickness of the lower electrode 24 and the upper electrode 26. In addition, the thicknesses of the lower electrode 24 and the upper electrode 26 may basically be identical to each other or different from each other.

Here, similarly to the lower protective layer 28 and upper protective layer 30 mentioned above, in a case where the rigidity of the lower electrode 24 and the upper electrode 26 is too high, not only is the stretching and contracting of the piezoelectric layer 20 constrained, but also the flexibility is impaired. Therefore, it is advantageous in a case where the thicknesses of the lower electrode 24 and the upper electrode 26 are smaller as long as electrical resistance is not excessively high. That is, it is preferable that the lower electrode 24 and the upper electrode 26 are thin film electrodes.

The thickness of the lower electrode 24 and the upper electrode 26 is thinner than that of the protective layer, is preferably 0.05 μm to 10 μm, more preferably 0.05 μm to 5 μm, even more preferably 0.08 μm to 3 μm, and particularly preferably 0.1 μm to 2 μm.

Here, in the piezoelectric element 10, in a case where the product of the thicknesses of the lower electrode 24 and the upper electrode 26 and the Young's modulus is less than the product of the thicknesses of the lower protective layer 28 and the upper protective layer 30 and the Young's modulus, the flexibility is not considerably impaired, which is suitable.

For example, in a case of a combination consisting of the lower protective layer 28 and the upper protective layer 30 formed of PET (Young's modulus: approximately 6.2 GPa) and the lower electrode 24 and the upper electrode 26 formed of copper (Young's modulus: approximately 130 GPa), in a case where the thickness of the lower protective layer 28 and the upper protective layer 30 is 25 μm, the thickness of the lower electrode 24 and the upper electrode 26 is preferably less than or equal to 1.2 μm, more preferably less than or equal to 0.3 μm, and particularly preferably less than or equal to 0.1 μm.

In the piezoelectric element 10, it is preferable that the maximum value of the loss tangent (Tan δ) at a frequency of 1 Hz according to the dynamic viscoelasticity measurement exists at room temperature, and it is more preferable that a maximum value of greater than or equal to 0.1 exists at room temperature.

Accordingly, even in a case where the piezoelectric element 10 is subjected to large bending deformation from the outside at a comparatively slow vibration of less than or equal to a few Hz, it is possible to effectively diffuse the strain energy to the outside as heat, and thus it is possible to prevent a crack from being generated on the interface between the matrix and the piezoelectric particles.

In the piezoelectric element 10, it is preferable that the storage elastic modulus (E') at a frequency of 1 Hz according to the dynamic viscoelasticity measurement is 10 GPa to 30 GPa at 0° C., and 1 GPa to 10 GPa at 50° C. Regarding this condition, the same applies to the piezoelectric layer 20.

Accordingly, the piezoelectric element 10 is able to have large frequency dispersion in the storage elastic modulus (E'). That is, the piezoelectric element 10 is able to be rigid with respect to a vibration of 20 Hz to 20 kHz, and is able to be flexible with respect to a vibration of less than or equal to a few Hz.

In addition, in the piezoelectric element 10, it is preferable that the product of the thickness and the storage elastic modulus (E') at a frequency of 1 Hz according to the dynamic viscoelasticity measurement is $1.0 \times 10^5$ to $2.0 \times 10^6$ (1.0E+05 to 2.0E+06) N/m at 0° C., and $1.0 \times 10^5$ to $1.0 \times 10^6$ (1.0E+05 to 1.0E+06) N/m at 50° C. Regarding this condition, the same applies to the piezoelectric layer 20.

Accordingly, the piezoelectric element 10 is able to have appropriate rigidity and mechanical strength within a range not impairing the flexibility and the acoustic properties.

Furthermore, in the piezoelectric element 10, it is preferable that the loss tangent at a frequency of 1 kHz at 25° C. is greater than or equal to 0.05 in a master curve obtained by the dynamic viscoelasticity measurement. Regarding this condition, the same applies to the piezoelectric layer 20.

Accordingly, the frequency properties of a speaker using the piezoelectric element 10 are smoothened, and thus it is also possible to decrease the changed amount of acoustic quality in a case where the lowest resonance frequency $f_0$ is changed according to a change in the curvature of the speaker.

In the present invention, the storage elastic modulus (Young's modulus) and the loss tangent of the piezoelectric element 10, the piezoelectric layer 20, and the like may be measured by a known method. As an example, the measurement may be performed using a dynamic viscoelasticity measuring device DMS6100 (manufactured by SII Nanotechnology Inc.).

Examples of the measurement conditions include a measurement frequency of 0.1 Hz to 20 Hz (0.1 Hz, 0.2 Hz, 0.5 Hz, 1 Hz, 2 Hz, 5 Hz, 10 Hz, and 20 Hz), a measurement temperature of −50° C. to 150° C., a temperature rising rate of 2° C./min (in a nitrogen atmosphere), a sample size of 40 mm×10 mm (including the clamped region), and a chuck-to-chuck distance of 20 mm.

Filling Member

The filling member 70 is made by curing a liquid conductive material.

As the conductive material used as the filling member 70, silver paste, metal nanoparticle ink (Ag, Au), and the like can be used.

The viscosity of the conductive material is preferably 10 mPa·s (millipascal seconds) to 20 Pa·s (pascal seconds), more preferably 0.1 Pa·s to 15 Pa·s, and even more preferably 0.5 Pa·s to 10 Pa·s.

The specific resistance of the filling member 70 after curing is preferably $1 \times 10^{\wedge}-6$ (Ω·cm) to $1 \times 10^{\wedge}-3$ (Ω·cm), more preferably $1 \times 10^{\wedge}-6$ (Ω·cm) to $8 \times 10^{\wedge}-4$ (Ω·cm), and even more preferably $1 \times 10^{\wedge}-6$ (Ω·cm) to $1 \times 10^{\wedge}-4$ (Ω·cm).

Conductive Foil with Bonding Layer

The conductive foil with a bonding layer 72 has a bonding layer on one surface of a conductive sheet which is a sheet-like material formed of a metal material having conductivity. Copper, aluminum, gold, silver, and the like are suitably exemplified as the material of the conductive sheet.

The bonding layer of the conductive foil with a bonding layer 72 may be any one as long as the bonding layer can adhere the conductive sheet and the protective layer. As the material of the adhesive layer, a conductive acrylic adhesive material is suitably exemplified.

In addition, the shape and size of the conductive foil with a bonding layer 72 are not particularly limited. The shape and size of the conductive foil with a bonding layer 72 may be shape and size such that the opening portion 73 can be formed, the filling member 70 can be formed, the conductive member 76 can be connected, and the driving of the piezoelectric element 10 is not constrained.

In addition, the thickness of the conductive foil with a bonding layer 72 is not particularly limited as long as it can secure electrical connection with the filling member 70 and the conductive member 76 and does not restrain the driving of the piezoelectric element 10.

Covering Member

The covering member 74 is an insulating sheet-like member.

Examples of the material of the covering member 74 include polyimide, heat-resistant PET, and the like.

In addition, the shape and size of the covering member 74 are not particularly limited. The shape and size of the covering member 74 may be any shape and size at which the covering member 74 can cover at least a part of the filling member 70 and the conductive foil with a bonding layer 72 to suppress the filling member 70 from being pulled, and a through-hole can be provided at a position that does not overlap with the filling member 70, and the driving of the piezoelectric element 10 is not constrained.

As described above, the covering member 74 preferably covers the entire surface of the filling member 70, and more preferably covers the entire surface of the conductive foil with a bonding layer 72.

In addition, the thickness of the covering member 74 is not particularly limited as long as it can suppress the filling member 70 from being pulled and does not restrain the driving of the piezoelectric element 10.

Conductive Member

The conductive member 76 is a sheet-like or wire-like member formed of a metal material having conductivity. Copper, aluminum, gold, silver, and the like are suitably exemplified as the material of the conductive member 76.

The shape and size of the conductive member 76 are not particularly limited. The shape and size of the conductive member 76 may be any shape and size that can be electrically connected to the conductive foil with a bonding layer 72 in the through-hole 75 of the covering member 74 and can be used as a drawer electrode.

A method of connecting the conductive member 76 to the conductive foil with a bonding layer 72 is not particularly limited, and known methods such as a method using solder, a method using a conductive adhesive, and welding can be used.

Next, an example of a manufacturing method of the piezoelectric element 10 will be described with reference to FIGS. 4 to 10.

Figure 4:
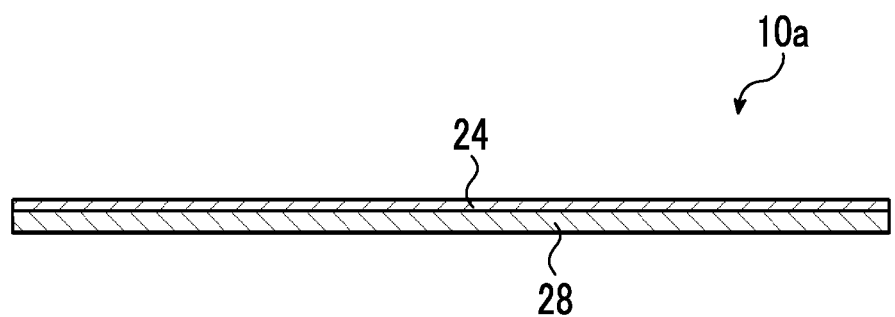
FIG. 4 is a conceptual view for describing an example of a method of preparing a piezoelectric element.

First, as illustrated in FIG. 4, a sheet-like material 10a is prepared in which the lower electrode 24 is formed on the lower protective layer 28. The sheet-like material 10a may be prepared by forming a copper thin film or the like as the lower electrode 24 on the surface of the lower protective layer 28 by carrying out vacuum vapor deposition, sputtering, plating, or the like.

In a case where the lower protective layer 28 is extremely thin, and thus the handleability is degraded, the lower protective layer 28 with a separator (temporary support) may be used as necessary. Further, a PET having a thickness of 25 μm to 100 μm or the like can be used as the separator. The separator may be removed after thermal compression bonding of the upper electrode 26 and the upper protective layer 30 and before laminating any member on the lower protective layer 28.

Meanwhile, the coating material is prepared by dissolving a polymer material serving as a material of the matrix in an organic solvent, adding the piezoelectric particles 36 such as PZT particles thereto, and stirring the solution for dispersion.

The organic solvent other than the above-described substances is not limited, and various organic solvents can be used.

Figure 5:
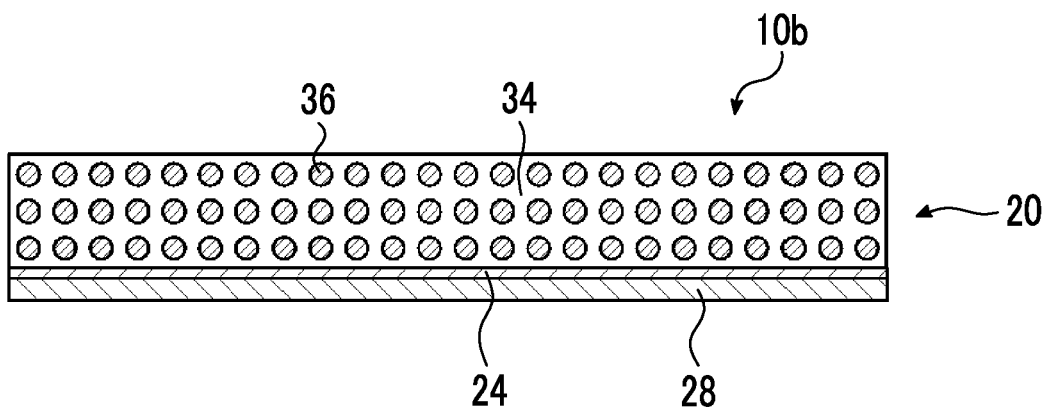
FIG. 5 is a conceptual view for describing an example of a method of preparing a piezoelectric element.

In a case where the sheet-like material 10a is prepared and the coating material is prepared, the coating material is cast (applied) onto the sheet-like material 10a, and the organic solvent is evaporated and dried. Accordingly, as illustrated in FIG. 5, a laminate 10b in which the lower electrode 24 is provided on the lower protective layer 28 and the piezoelectric layer 20 is formed on the lower electrode 24 is prepared. The lower electrode 24 refers to an electrode on the base material side in a case where the piezoelectric layer 20 is applied, and does not indicate the vertical positional relationship in the laminate.

A casting method of the coating material is not limited, and all known methods (coating devices) such as a slide coater or a doctor knife can be used.

As described above, in the piezoelectric element 10, in addition to the viscoelastic material such as cyanoethylated PVA, a dielectric polymer material may be added to the matrix 34.

In a case where the polymer material is added to the matrix 34, the polymer material added to the above-described coating material may be dissolved.

In a case where the laminate 10b in which the lower electrode 24 is provided on the lower protective layer 28 and the piezoelectric layer 20 is formed on the lower electrode 24 is prepared, it is preferable that the piezoelectric layer 20 is subjected to a polarization treatment (poling).

A polarization processing method of the piezoelectric layer 20 is not limited, and a known method is able to be used.

Before the polarization processing, calender processing may be performed to smoothen the surface of the piezoelectric layer 20 using a heating roller or the like. By performing the calender processing, a thermal compression bonding process described below is able to be smoothly performed.

In this way, while the piezoelectric layer 20 of the laminate 10b is subjected to the polarization processing, a sheet-like material 10c is prepared in which the upper electrode 26 is formed on the upper protective layer 30. This sheet-like material 10c may be prepared by forming a copper thin film or the like as the upper electrode 26 on the surface of the upper protective layer 30 using vacuum vapor deposition, sputtering, plating, or the like.

Figure 6:
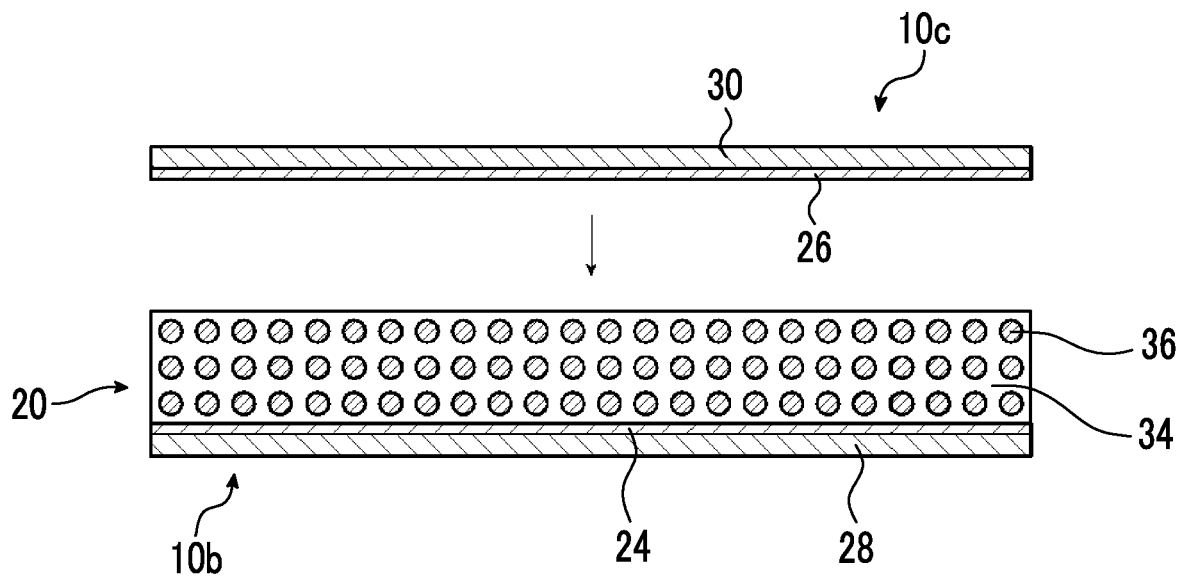
FIG. 6 is a conceptual view for describing an example of a method of preparing a piezoelectric element.

Next, as illustrated in FIG. 6, the sheet-like material 10c is laminated on the laminate 10b in which the piezoelectric layer 20 is subjected to the polarization processing while the upper electrode 26 faces the piezoelectric layer 20.

Furthermore, a laminate of the laminate 10b and the sheet-like material 10c is interposed between the upper protective layer 30 and the lower protective layer 28, and is subjected to the thermal compression bonding using a heating press device, a heating roller pair, or the like.

By the above steps, a laminate in which an electrode layer and a protective layer are laminated on both surfaces of the piezoelectric layer 20 is prepared. The prepared laminate may be cut into a desired shape according to various usages.

Such a laminate may be prepared using a cut sheet-like material, or may be prepared by roll-to-roll (hereinafter, also referred to as RtoR).

Next, a hole is provided in the protective layer of the laminate, a conductive foil with a bonding layer is laminated, a filling member is filled and covered with a covering member, and the conductive member is connected to the conductive foil with a bonding layer.

Figure 7:
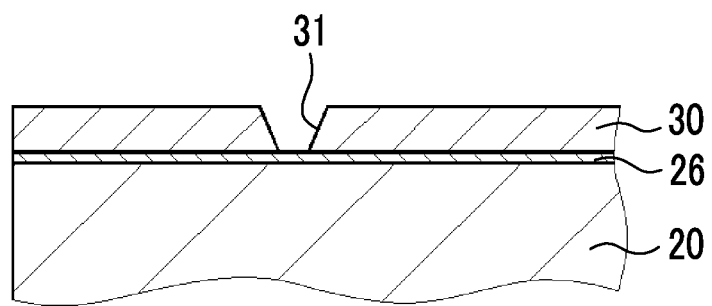
FIG. 7 is a conceptual view for describing an example of a method of preparing a piezoelectric element.

Specifically, first, as illustrated in FIG. 7, a hole 31 is formed in the upper protective layer 30, and a hole 29 is formed in the lower protective layer 28.

The hole 31 is formed by a method of laser processing (carbon dioxide laser, and the like), a method of making a cut in the protective layer in the depth direction (for example, the thickness of the protective layer is 10 μm and the thickness of the electrode layer is 2 μm, the protective layer is formed by making a circular cut from 8 to 9.5 μm in the thickness direction of the protective layer and then peeling off the circular portion) by press processing to peel off the protective layer, and the like.

Figure 8:
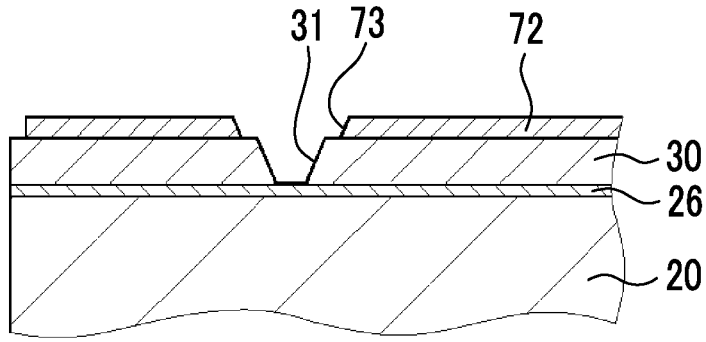
FIG. 8 is a conceptual view for describing an example of a method of preparing a piezoelectric element.

After the holes are provided in the protective layer, the conductive foil with a bonding layer 72 is laminated on the protective layer as illustrated in FIG. 8. Here, in a case where the opening portion 73 is formed in advance in the conductive foil with a bonding layer 72, the conductive foil with a bonding layer 72 may be laminated at a position where the opening portion 73 overlaps with the hole of the protective layer.

Alternatively, the conductive foil with a bonding layer 72 in which the opening portion 73 is not formed may be laminated so as to cover the hole, and then the opening portion 73 may be provided in the conductive foil with a bonding layer 72.

Figure 9:
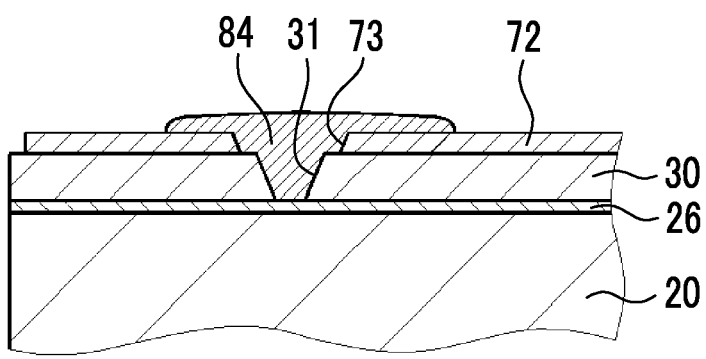
FIG. 9 is a conceptual view for describing an example of a method of preparing a piezoelectric element.

After laminating the conductive foil with a bonding layer 72 on the protective layer, as illustrated in FIG. 9, a liquid conductive material 84 is applied from the opening portion 73 of the conductive foil with a bonding layer 72 to the hole. At the time of application, the conductive material 84 is applied so as to protrude from the opening portion 73 onto the surface of the conductive foil with a bonding layer 72.

As a method for applying the conductive material 84, silk screen printing, dripping with a dispenser, application with a brush, or the like can be used.

After applying the conductive material 84, the conductive material 84 is cured to form the filling member 70.

A method of curing the conductive material 84 may be performed by a method according to the conductive material 84. For example, as the method of curing the conductive material 84, heat drying and the like can be exemplified.

Figure 10:
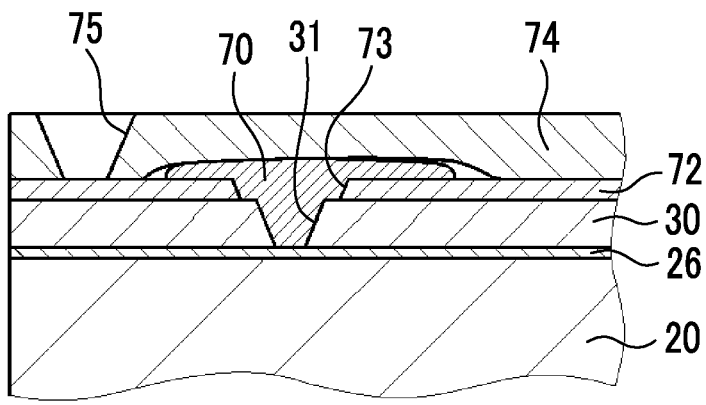
FIG. 10 is a conceptual view for describing an example of a method of preparing a piezoelectric element.

After forming the filling member 70, as illustrated in FIG. 10, the covering member 74 is laminated on the filling member 70 and the conductive foil with a bonding layer 72. Here, in a case where the through-hole 75 is formed in advance on the covering member 74, the covering member 74 may be laminated at a position where the through-hole 75 does not overlap with the filling member 70 and overlaps with the conductive foil with a bonding layer 72.

Alternatively, after laminating the covering member 74 on which the through-hole 75 is not formed so as to cover the filling member 70 and the conductive foil with a bonding layer 72, the through-hole 75 may be provided at a position that overlaps with the conductive foil with a bonding layer 72.

The covering member 74 may be adhered to the conductive foil with a bonding layer 72 or a protective layer with an adhesive, a bonding agent, or the like.

After laminating the covering member 74, the conductive member 76 is electrically connected to the conductive foil with a bonding layer 72 in the through-hole 75 of the covering member 74.

As described above, the conductive member 76 and the conductive foil with a bonding layer 72 may be connected by a solder, a conductive adhesive, or the like.

The piezoelectric element of the embodiment of the present invention is manufactured by the above steps.

In a case where a voltage is applied to the lower electrode 24 and the upper electrode 26 of such a piezoelectric element 10, the piezoelectric particles 36 stretch and contract in the polarization direction according to the applied voltage. As a result, the piezoelectric element 10 (piezoelectric layer 20) contracts in the thickness direction. At the same time, the piezoelectric element 10 stretches and contracts in the in-surface direction due to the Poisson's ratio. The degree of stretching and contracting is about 0.01% to 0.1%. In the in-surface direction, those that stretch and contract isotropically in all directions are as described above.

As described above, the thickness of the piezoelectric layer 20 is preferably about 10 to 300 μm. Therefore, the degree of stretching and contracting in the thickness direction is as very small as about 0.3 μm at the maximum.

Contrary to this, the piezoelectric element 10, that is, the piezoelectric layer 20, has a size much larger than the thickness in the surface direction. Therefore, for example, in a case where the length of the piezoelectric element 10 is 20 cm, the piezoelectric element 10 stretches and contracts by a maximum of about 0.2 mm as a voltage is applied.

In addition, in a case where a pressure is applied to the piezoelectric element 10, electric power is generated by the action of the piezoelectric particles 36.

By using this, the piezoelectric element 10 can be used for various usages such as a speaker, a microphone, and a pressure-sensitive sensor, as described above.

Here, it is known that in a case where a general piezoelectric element consisting of a polymer material such as PVDF has in-plane anisotropy in the piezoelectric properties, and has anisotropy in the amount of stretching and contracting in the surface direction in a case where a voltage is applied.

Contrary to this, the piezoelectric layer consisting of a polymer composite piezoelectric body containing piezoelectric particles in a matrix including a polymer material has no in-plane anisotropy in the piezoelectric properties, and stretches and contracts isotropically in all directions in the surface direction.

According to the piezoelectric element 10 that stretches and contracts isotropically and two-dimensionally, compared to a case where a general piezoelectric element made of PVDF or the like that stretch and contract greatly in only one direction is laminated, the vibration can occur with a large force, and a louder and more beautiful sound can be generated.

In the example illustrated in FIG. 1, the configuration is such that one piezoelectric element 10 is provided, but the present invention is not limited to this. A plurality of piezoelectric elements 10 of the embodiment of the present invention may be laminated. In addition, the piezoelectric element 10 of the embodiment of the present invention may have a long shape and may be folded back once or more, preferably a plurality of times in the longitudinal direction to form a stack of a plurality of layers of the piezoelectric element 10.

Hereinabove, while the piezoelectric element of the embodiment of the present invention have been described in detail, the present invention is not limited to the examples described above, and various improvements or modifications may be naturally performed within a range not deviating from the gist of the present invention.

As described above, the effects of the present invention are apparent.

The piezoelectric element can be suitably used for various usages such as audio equipment including speakers and microphones and pressure-sensitive sensors.

EXPLANATION OF REFERENCES

10: piezoelectric element
10a, 10c: sheet-like material
10b: laminate
20: piezoelectric layer
24: lower electrode
26: upper electrode
28: lower protective layer
29, 31: hole
30: upper protective layer
34: matrix
36: piezoelectric particles
70: filling member
72: conductive foil with an adhesive layer
73: opening portion
74: covering member
75: through-hole
76: conductive member
84: conductive material

What is claimed is:

1. A piezoelectric element comprising:
a piezoelectric layer;
electrode layers formed on both sides of the piezoelectric layer; and
a protective layer laminated on a surface of the electrode layer opposite to a surface on a piezoelectric layer side,
wherein the piezoelectric element includes a conductive foil laminated on a surface of the protective layer opposite to the electrode layer,
the protective layer has a hole that penetrates from a surface to the electrode layer,
the conductive foil includes an opening portion at a position that overlaps with the hole of the protective layer in a surface direction,
the piezoelectric element includes a filling member consisting of a conductive material, which is formed on at least a part of a surface of the conductive foil from insides of the hole of the protective layer and an opening portion of the conductive foil and is electrically connected to the electrode layer and the conductive foil, and a covering member that covers at least a part of the filling member and the conductive foil,
the covering member has a through-hole at a position that does not overlap with the filling member in the surface direction, and
the piezoelectric element includes a conductive member, which is inserted into the through-hole of the covering member and electrically connected to the conductive foil.

2. The piezoelectric element according to claim 1, wherein the covering member covers an entire surface of the filling member and the conductive foil.

3. The piezoelectric element according to claim 2, wherein the protective layer has a plurality of the holes, the filling member is provided in each of the plurality of holes, and
a plurality of the filling members are connected on the surface of the conductive foil.

4. The piezoelectric element according to claim 2, wherein a thickness of the protective layer is 3 µm to 100 µm.

5. The piezoelectric element according to claim 2, wherein a thickness of the electrode layer is 0.05 µm to 10 µm.

6. The piezoelectric element according to claim 2, wherein the piezoelectric layer consists of a polymer composite piezoelectric body containing piezoelectric particles in a matrix containing a polymer material.

7. The piezoelectric element according to claim 1, wherein the protective layer has a plurality of the holes, the filling member is provided in each of the plurality of holes, and
a plurality of the filling members are connected on the surface of the conductive foil.

8. The piezoelectric element according to claim 7, wherein a thickness of the protective layer is 3 µm to 100 µm.

9. The piezoelectric element according to claim 7, wherein a thickness of the electrode layer is 0.05 µm to 10 µm.

10. The piezoelectric element according to claim 7, wherein the piezoelectric layer consists of a polymer composite piezoelectric body containing piezoelectric particles in a matrix containing a polymer material.

11. The piezoelectric element according to claim 1, wherein a thickness of the protective layer is 3 µm to 100 µm.

12. The piezoelectric element according to claim 11, wherein a thickness of the electrode layer is 0.05 µm to 10 µm.

13. The piezoelectric element according to claim 11, wherein the piezoelectric layer consists of a polymer composite piezoelectric body containing piezoelectric particles in a matrix containing a polymer material.

14. The piezoelectric element according to claim 1, wherein a thickness of the electrode layer is 0.05 µm to 10 µm.

15. The piezoelectric element according to claim 14, wherein the piezoelectric layer consists of a polymer composite piezoelectric body containing piezoelectric particles in a matrix containing a polymer material.

16. The piezoelectric element according to claim 1, wherein the piezoelectric layer consists of a polymer composite piezoelectric body containing piezoelectric particles in a matrix containing a polymer material.

* * * * *